(12) United States Patent
Fawcett

(10) Patent No.: US 11,300,590 B2
(45) Date of Patent: Apr. 12, 2022

(54) SWITCH SYSTEM AND METHOD FOR SWITCHING A SWITCH

(71) Applicant: Landis+Gyr AG, Cham (CH)

(72) Inventor: Timothy James Fawcett, Lincolnshire (GB)

(73) Assignee: Landis+Gyr AG, Cham (CH)

( * ) Notice: Subject to any disclaimer, the term of this patent is extended or adjusted under 35 U.S.C. 154(b) by 79 days.

(21) Appl. No.: 16/762,551

(22) PCT Filed: Nov. 7, 2018

(86) PCT No.: PCT/IB2018/058730
§ 371 (c)(1),
(2) Date: May 8, 2020

(87) PCT Pub. No.: WO2019/092601
PCT Pub. Date: May 16, 2019

(65) Prior Publication Data
US 2020/0341032 A1    Oct. 29, 2020

(30) Foreign Application Priority Data
Nov. 8, 2017 (CH) ..................... 01344/17

(51) Int. Cl.
*H01H 7/16* (2006.01)
*G01R 11/02* (2006.01)
(Continued)

(52) U.S. Cl.
CPC .............. *G01R 11/02* (2013.01); *G01K 13/00* (2013.01); *G05B 15/02* (2013.01); *H01H 7/16* (2013.01);
(Continued)

(58) Field of Classification Search
CPC .......... H02M 7/42; H02M 7/48; H02M 7/487; H02M 7/493; H02M 7/501; H02M 7/4826; H02M 7/49; H02M 7/4807; H02M 7/537; H02M 7/5387; H02M 7/533; H02M 7/53; H02M 7/53871; H02M 2007/4803; H02M 2007/4822; H02M 2007/4835;
(Continued)

(56) References Cited

U.S. PATENT DOCUMENTS

| 5,644,463 A | 7/1997 | El-Sharkawi et al. |
| 6,233,132 B1 | 5/2001 | Jenski |

(Continued)

FOREIGN PATENT DOCUMENTS

| EP | 1675147 A1 | 6/2006 |
| EP | 2068335 A1 | 6/2009 |
| FR | 2953938 A1 | 6/2011 |

OTHER PUBLICATIONS

International Search Report and Written Opinion, PCT Application No. PCT/IB2018/058730, dated Mar. 11, 2019.

*Primary Examiner* — Bryan R Perez
(74) *Attorney, Agent, or Firm* — Kilpatrick Townsend & Stockton LLP

(57) ABSTRACT

A switching system for an electricity meter, an electricity meter with a switch system and a method of switching switch are provided. In order to improve lifetime of the switch the timing of outputting a switching signal is adjusted based on a time difference between previously outputting the switching signal and achieving a predefined switching state.

18 Claims, 5 Drawing Sheets

(51) Int. Cl.
*G01K 13/00* (2021.01)
*G05B 15/02* (2006.01)
*H01H 9/54* (2006.01)
*H02M 3/158* (2006.01)
*H01H 47/02* (2006.01)
*H01H 47/18* (2006.01)
*H02M 1/00* (2006.01)
*H01H 9/30* (2006.01)

(52) U.S. Cl.
CPC .............. *H01H 9/54* (2013.01); *H01H 47/02* (2013.01); *H01H 47/18* (2013.01); *H02M 3/158* (2013.01); *H01H 2009/307* (2013.01); *H02M 1/0058* (2021.05)

(58) Field of Classification Search
CPC ...... H02M 1/08; H02M 1/088; H02M 1/4225; H02M 1/4208; H02M 3/33507; H02M 3/156; H02M 3/158; H02M 3/157; H02M 3/1582; H02M 3/33515; H02M 3/33523; H01H 9/56; H01H 9/542
See application file for complete search history.

(56) References Cited

U.S. PATENT DOCUMENTS

| | | | |
|---|---|---|---|
| 8,976,544 B2* | 3/2015 | Bajan | H02M 7/53871 363/17 |
| 2012/0217795 A1* | 8/2012 | Hasegawa | B60L 3/003 307/9.1 |
| 2014/0169053 A1* | 6/2014 | Ilic | H02J 3/387 363/132 |
| 2014/0328102 A1* | 11/2014 | Wang | H02J 3/381 363/132 |

* cited by examiner

40

SWITCH SYSTEM AND METHOD FOR SWITCHING A SWITCH

The present invention relates to a switch system for an electricity meter with at least one switch, namely a supply control switch and/or a load control switch, wherein the switch system comprises a control device that is adapted to output a switching signal to the at least one switch for starting a switching event of the at least one switch. Furthermore, the present invention relates to an electricity meter with a switch system and with at least one switch, namely a supply control switch and/or a load control switch. Finally, the present invention relates to a method for switching a switch.

Technological Background

Switch systems for electricity meters, electricity meters with switch systems and methods for switching switches are well known in the art. For reducing wear and tear of switch contacts of the switches, it desirable to make or break mechanical contacts of the switch contacts when the electrical power, e.g. AC electrical power like the AC electrical voltage and/or the AC electrical current, to be switched has a zero crossing, such that a formation of arcs is at least reduced or even prevented. In order to be able to switch the switch, i.e. to open or close the switch or to break or make the physical contact of the switch contacts of the switch, an delay between outputting a switch signal to the switch and the end of the switching event, i.e. when the switch has reached a predetermined switching state, is estimated during the design phase of the switch. However, during the lifetime of the switch, the delay changes, such that the timing of the switching events with respect to the zero crossing may not be optimal. As a result, switches according to the prior art have the disadvantage that due to suboptimal timing of switching events, the lifetime of the switches is decreased.

Description of the Invention

In view of the above-mentioned disadvantage, an object underlying the invention is to provide a switch system, an electricity meter and a method that increase lifetime of the switch.

The object is achieved according to the invention in that the switch system comprises a sensor that is adapted to transform the output current and/or the output voltage of the at least one switch into the sensor signal, the sensor being connected to the control device in a sensor signal transmitting manner, wherein the control device is adapted to determine the switching state of the at least one switch based on the sensor signal, to determine the time difference between a first point in time at which the switching signal is output, and a second point time, and which that switching state of the at least one switch corresponds to a predefined switching state, and to adjust the timing of the output of the switching signal based on the time difference and with respect to a zero crossing of an AC voltage and/or AC current to be switched.

For the above-mentioned electricity meter, the object is achieved in that the electricity meter comprises a switch system according to the invention.

For the above-mentioned method, the object is achieved in that the method comprises outputting a switch signal to a switch at the first point in time, determining a switching state of the switch based on a voltage and/or a current output by the switch, determining a second point in time at which the switching state corresponds to the predefined switching state, determining the time difference between the first point in time and the second point in time, and adjusting the timing of a switching signal to be output based on the time difference and with respect to a zero crossing of an AC voltage and/or an AC current to be switched.

As the time difference is determined while the switch is in use, and in particular as the time difference is determined based on the sensor signal that is generated under real world switching conditions, which may vary over time, the timing of the output of the switching signal allows for an opening or closing of the switch, i.e. breaking or making the physical contact of the switch contacts of the switch, exactly at or at least very close to the zero crossing, even if the delay between outputting the switch signal and the end of the switching event deviates from the estimated delay due to the current conditions.

The solutions according to the invention can be combined as desired and further improved by the further following embodiments that are advantages on their own, in each case.

According to a possible embodiment of the switch system, the switch system comprises another sensor that is adapted to transform the current drawn from a switching coil of the at least one switch into another sensor signal, and that is connected to the control device in the sensor signal transmitting manner, wherein the control device is adapted to adjust the timing of the output of the switching signal based on the other sensor signal.

According to a possible embodiment of the method, the method comprises the step of determining the current drawn from a switching coil of the at least one switch, and by adjusting the timing of the switching signal to be output based on the current drawn from the switching coil.

For example, over time or with a temperature change, the electrical resistance of the coil may change, which results in a change of the current drawn by the coil. A change of the current drawn by the coil affects the switching forces caused by the switching coil, which results in a different acceleration of the switch contact of the switch when opening or closing the switch. Hence, monitoring the current drawn by the coil during a current switching event may indicate that at the current coil resistance, the switch signal needs to be output earlier or later with respect to an upcoming zero crossing. Additionally, mechanical resistance acting to inhibit movement of the switch contact, which may change with temperature, can be determined based on the other sensor signal. This embodiment can be advantageous on its own such that the timing can be adjusted based on the other sensor signal without previously determining the time difference.

According to another possible embodiment of the switch system, the control device is adapted to determine a move period that starts when the switching signal is output or when a switching contact of the switch begins to move during the switching event and that ends when the switch is in the or another predefined switching state based on the other sensor signal, wherein the control device is adapted to adjust the timing of the output of the switch signal based on the duration of the moving period.

According to another possible embodiment of the method, based on the current drawn from the switching coil, a move period that starts when the switching signal is output or when a switching contact of the switch begins to move during the switching event and that ends when the switch is in the or another predefined switching state is determined, and in that the timing of the switching signal to be output is adjusted based on the duration of the move period.

In determination of duration of the moving period all parameters like coil resistance and the mechanical resistance are considered in just one parameter, i.e. preferably a single control value. Hence, the moving period can easily be used for adjusting the timing of the output of the switch signal, for example by using the duration of the moving period as a variable when calculating the timing of the output, such that elaborate calculations for adjusting the timing may be omitted. Again, previously determining the time difference based on the sensor signal may not strictly be required. In particular, the change over time of the current can be used for controlling the switch system.

According to another possible embodiment of the switch system, the control device is adapted to determine a wear and tear state of the switch or to adjust another switching parameter based on the sensor signal, e.g. based on the time difference, and/or based on the other sensor signal, e.g. based on the current drawn by the switching coil or on the move period. In particular, the change over time of the current can be used for determining the wear and tear state.

According to another possible embodiment of the method, the method comprises the step of determining a wear and tear state of the switch or by adjusting another switching parameter based the sensor signal, e.g. based on the time difference, and/or based on the other sensor signal, e.g. based on the current drawn by the switching coil or on the move period. Even in case the switch has not been actuated, i.e. switched for a longer period of time, e.g. hours, days or even weeks, the coil current can be used to directly gain information concerning the state of the switch, such that the voltage applied to the coil can be changed in order to reduce the formation of an arc.

For example, the switch contacts may erode over time, which results in a longer or a shorter move period as the distance between contact surfaces of the switch contacts differs in the eroded state compared to a non-eroded state. Furthermore, temperature changes may affect the electrical resistance of the coil or the mechanical resistance of parts of the switch, thereby changing the duration of the move period. Additionally or alternatively, the resistance of the coil and the mechanical resistance may change even without the effect of temperature, for example if over time, an insulation of wires of the coil deteriorates or dirt or dust enters the switch. In the event that a determined wear and tear is worse than a predetermined allowable wear and tear, a maintenance signal can be generated and output by the control device, for example via an optical and/or an electrical signal output of the control device or of the electricity meter. In case the electricity meter is connected to a server in a data transmitting manner, the maintenance signal can be output to the server.

According to another possible embodiment of the switch system, the system comprises yet another sensor that is adapted to transform the temperature of the switch into a temperature sensor signal, and that is connected to the control device in a sensor signal transmitting manner, wherein the control device is adapted to adjust the timing of the output of the switching signal based on the temperature sensor signal.

According to another possible embodiment of the method, the method comprises determining the temperature of the switch and by adjusting the timing of the output of the switching signal based on the temperature.

In particular, if the switch was not switched for a longer period in time, for example several hours, days or even weeks, such that the ambient conditions and in particular the temperature may have changed significantly, for example by up to 10 Kelvin or more, previously determined time differences, other sensor signals or move periods may not represent the current state of the switch with a desired accuracy. Yet, based on the current temperature represented by the temperature sensor signal allows for a precise adjustment of the timing of the output of the switch signal, even without recent determinations of the time difference, the other sensor signal and/or the move period. Thus, adjusting the timing of the output may be advantageous on its own. In combination with still valid values for the time difference, the other sensor signal and/or the move period, taking into account temperature values allows for an even more precise timing.

According to a possible embodiment of the computer program product, the computer program product may be a portable data medium, e.g. a magnetic data medium like a floppy disc, an optical data medium like a compact disc (CD) or a digital versatile disc (DVD), or any other portable data medium like a USB stick. Alternatively, the computer program product may be installed on a portable or stationary computer of on a server directly in or at the switch system or remote from the switch system.

Switching states may be that the at least one switch is open or closed. Furthermore, the sensor signal can represent intermediate switching states, in particular when closing the at least one switch. During the intermediate switching states, the switching contacts of the at least one switch may repeatedly make and break contact with each other, as they bounce against each other due to mechanical properties, in particular spring properties of the at least one switch. For example, voltage transitions may be measured as the switching contacts bounce. The number and/or the duration of the bounces can be used in order to determine the behavior and, thus, the state of the switch, such that the timing of the output can be adjusted also based on the number and/or the duration of the bounces. The timing may be adjusted such that the zero crossing occurs preferably in the middle of the period during which the switching contacts bounce.

The middle of the time period between the first contact of the switching contacts (Tcc) and the time of the last bounce of the contacts (Tcs) may be determined and may be multiplied with a correction factor (C) that is determined based on the temperature and the wear and tear. The resulting value may be subtracted from the previous time required for closing the switch (Toc) in order to determine the first point in time (Tst, $Tst=Toc-0{,}5*(Tcc+Tcs)*C$). If the bouncing does not result in voltage transitions during a period of up to 100 ms, 75 ms, 50 ms or 25 ms, it is assumed that the switching event did not cause any arcs, such that the timing and the other switching parameters need not to be adjusted.

In the event that the period between the first contact of the switching contacts and the last bounce increases, this increase may be used as a basis for generating the maintenance signal. In particular, if the period between the first contact of the switching contacts and the last bounce is longer than a predetermined period, the maintenance signal can be generated.

The predefined switching state may be a switching state, at which the switching event ends, for example a switching state, at which the switch has just reached the open or the closed state. The just reached opened state may be characterized in that no current flows through the output terminal of the switch. The just reached closed state may be characterized in that no voltage transitions appear anymore or in that current flowing through the output terminal corresponds to current expected to flow when the switch is completely closed. Additionally or alternatively, the switching state can be determined by the coil current, wherein the coil current changes during the switching event and stabilizes towards the end of the switching event. The stable coil current may represent the redefined switching state.

The switching signal may a rise of a fall of the voltage applied to the coil at the begin of the switching event. The at least one switch may be a relay. The control device may be adjusted and the method may be performed to adjust the timing at every switching even.

The switch system may be adapted to adjust the timing only for one of the switches, for example in case the other switches are switched load free and in particular in case another one of the switches upstream is open while open or closing the other switches. Alternatively, the switch system may be adapted to adjust the timing for more than one and in particular for all of the switches that switch electrical energy for the load and to be measured by the electricity meter. In general, the system and method according to the present invention are capable of switching numerous switches connected to the electricity meter, including but not limited to load and supply control switches that are both internal to the electricity meter and/or mounted externally to it in order to switch internal and external functions, respectively, related to the meter, including functions and/or electrical supply of auxiliary components connected to the electricity meter.

In particular, when the switch event is an open-switch-event, the output of the switching signal may be timed such that the switch contacts of the at least one switch move away from each other and break contact while the current through the switch has a zero crossing. In case the switch event is a close-switch-event, the output of the switching signal may be timed such that the switch contacts of the at least one switch are brought in physical contact with each other and make contact while the voltage at the contacts has a zero crossing. Hence, as the timing results in that the switching contacts make or break contact at or very close to the zero crossing, arcs may be totally prevented as long as the voltage or the current at the zero crossing and while the switch elements make or break contact is below a threshold at which arcs may occur.

BRIEF DESCRIPTION OF THE DRAWINGS

The invention will be described hereinafter in more detail and in an exemplary manner using advantageous embodiments and with reference to the drawings. The described embodiments are only possible configurations in which, however, the individual features as described above can be provided independent of one another or can be omitted in the drawings.

WAYS OF EXECUTING THE INVENTION

Figure 1:
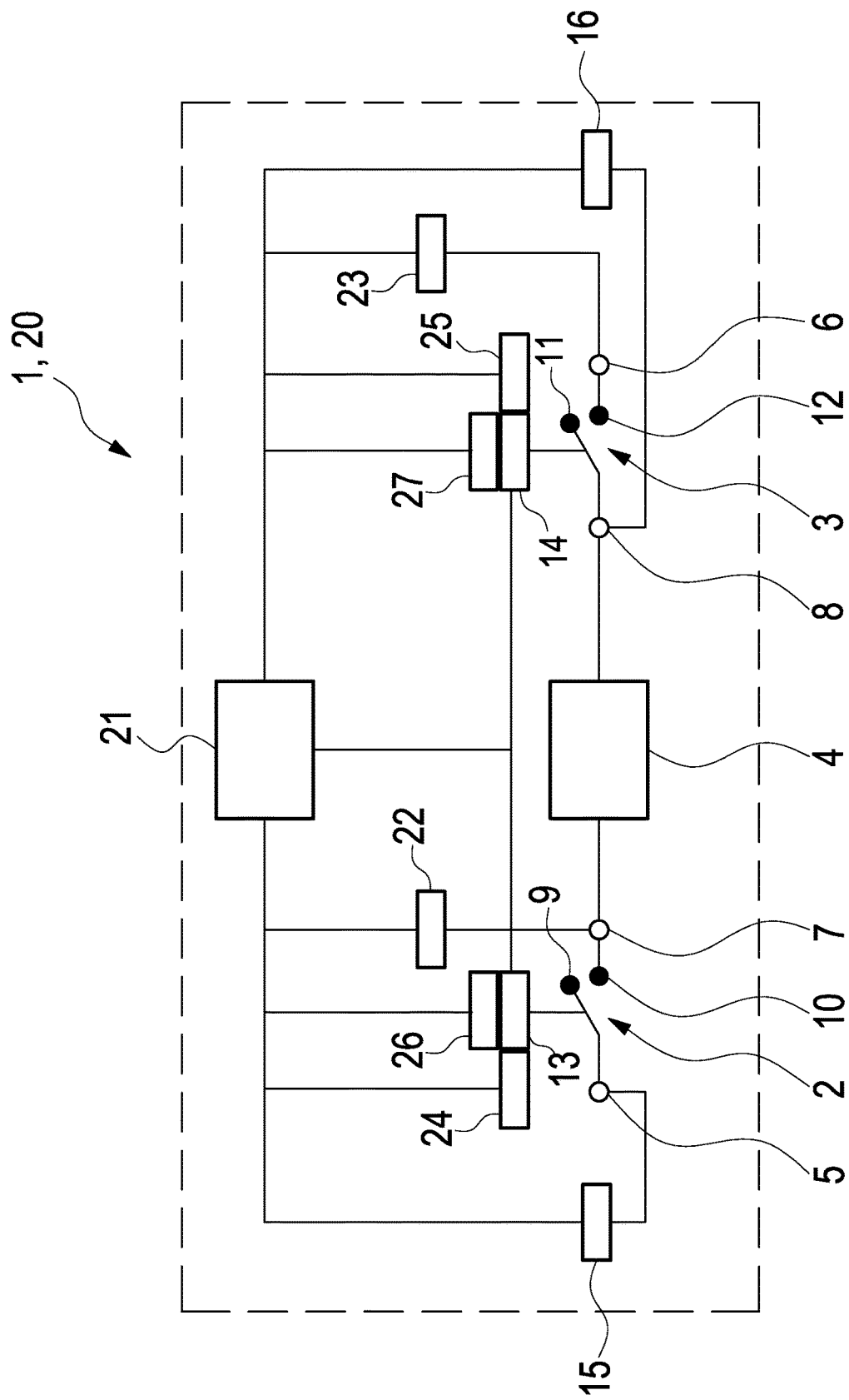
FIG. 1 shows an exemplary embodiment of the switch system according to the present invention as part of an electricity meter.

FIG. 1 shows an exemplary embodiment of an electricity meter 1 with two switches 2, 3 and with a metering device 4 that interconnects the switches 2, 3. For example, switch 2 is a supply control switch and switch 3 is a load control switch. Hence, a terminal 5 of the supply control switch 2 may be provided in order to connect the electricity meter 1 to a power supply, for example a public power or energy grid. Terminal 5 may be designated as input terminal. Furthermore, load control switch 3 may comprise a terminal 6 for connecting a load to be supplied with electrical energy. Thus, terminal 6 may be designated as output terminal.

Additionally, supply control switch 2 may comprise an output terminal 7 to which the metering device 4 is connected and which receives electrical energy from the power supply, in case the supply control switch 2 is enclosed. The metering device 4 determines the amount of electrical energy provided to the load in case the load control switch 3 is closed. The metering device 4 is connected to an input terminal 8 in an electrical energy conducting manner.

Typically, the supply control switch 2 and the load control switch 3 are provided as relays, such that the switches 2, 3 can be switched automatically and/or remotely. In general, a relay comprises two switching contacts 9, 10, 11, 12, wherein one of the switching contacts 9, 11 may be driven and thereby moved for opening or closing the respective relay, and the other one of the switching contacts 10, 12 may be a stationary switching contact. In order to drive the driven switching contacts 9, 11, each of the switches 2, 3 comprises a switching coil 13, 14, which moves the drill switching contact 9, 11, on receipt of a switching signal.

In order to generate and output the switching signal, known electricity meters comprise a control device, that is connected to the switching coils 13, 14 in a switching signal transmitting manner. Generally, the control device times the output of the switching signal with respect to a zero crossing of the power to be switched, such that generation of arcs at the switching contacts 9, 10, 11, 12 and therefore wear and tear of the switching contacts 9, 10, 11, 12 is reduced. In order to be able to time the output, known electricity meters may comprise at least one power sensor 15, 16 that is connected to the input terminal 5, 8 of the switch 2, 3. The power sensor 15, 16 is adapted to transform the electrical power, for example the electrical voltage or the current at the input terminal 5, 8 into a power sensor signal that is transmitted to the control device. The control device determines the zero crossings of the power.

There is a delay between outputting the switching signal and completing the switching events. Hence, known control devices comprise data that represent an estimated delay, such that formation of arcs is recused. However, arcs still appear, which cause wear and tear of the switching contacts 9, 10, 11, 12, resulting in an early failure of the respective switch 2, 3.

The electricity meter 1 according to the invention and as shown in FIG. 1 may be based on the described known electricity meter and comprises a switching system 20 according to the invention. The switching system 20 comprises a control device 21, which may be added to the control device of a known electricity meter or which may be used instead of the control device of the known electricity meter.

Additionally, the switching system 20 comprises at least one sensor 22, 23 that is connected to one of the switches 2, 3 and in particular to the respective output terminal 6, 7 of the switch 2, 3. For example, the which system 20 comprises a sensor 22, 23 for each switch 2, 3, i.e. for each supply control switch 2 and each load control switch 3 of the electricity meter 1.

Based on the voltage and/or the current at the respective output terminal 6, 7, the sensor 22, 23 generates a sensor signal. The sensor 22, 23 is connected to the control device 21 in a sensor signal transmitting manner. Based on the sensor signal, the control device 21 determines a switching state of the respective switch 2, 3.

The control device 21 is adapted to determine the switching state of the at least one switch 2, 3 based on the sensor signal, to determine a time difference between a first point in time at which the switching signal is output, and a second point in time, at which the switching state of the at least one switch 2, 3 corresponds to a predefined switching state, and to adjust the timing of the output of the switching signal based on the time difference and with respect to a zero crossing of an AC voltage and/or current to be switched Switching states may be that the switch 2, 3 is open or closed. Furthermore, the sensor signal can represent intermediate switching states, in particular when closing the switch 2, 3. During the intermediate switching states, the switching contacts 9, 10 and 11, 12 of the switch 2, 3 may repeatedly make and break contact with each other, as they bounce against each other due to mechanical properties of the switch 2, 3. For example, voltage transitions may be measured as the switching contacts 9, 10 and 11, 12 bounce.

The predefined switching state may be a switching state, at which the switching event ends, for example a switching state, at which the switch 2, 3 has just reached the open or the closed state. The just reached opened state may be characterized in that no current flows through the output terminal 10, 11 of the switch 2, 3. The just reached closed state may be characterized in that no voltage transitions appear anymore the output terminal 10, 11 of the switch 2, 3 or in that current flowing through the output terminal 10, 11 of the switch 2, 3 corresponds to current expected to flow when the switch 2, 3 is completely closed.

Additionally or alternatively, the switching system 20 comprises another sensor 24, 25, that is connected to the control device 21 in a sensor signal transmitting manner. The other sensor 24, 25 is adapted to transform the current drawn from the switching coil 13, 14 into another sensor signal. The control device 21 is adapted to adjust the timing of the output of the switching signal based on the other sensor signal.

Based on the other sensor signal, the control device 21 can determine a move period that starts when the switching signal is output or when the driven switching contacts 9, 11 begins to move during the switching event. The switching event can be started by outputting the switching signal.

Based on the sensor signal or the other sensor signal, the control device 21 can determine wear and tear of the respective switch 2, 3 and for example of the switching contacts 9, 10, 11, 12. For example, the switching contacts 9, 10, 11, 12 can be a deformed due to arcs, such that the distance between the respective pairs of switching contacts 9, 10 or 11, 12 in the completely opened state of the switch 2, 3 differs from an initial distance. Additionally or alternatively, the electrical resistance of the switching coil can differ from an initial resistance, for example if the electrical insulation of the wires of the coil is affected, e.g. by time or by operating conditions.

Additionally or alternatively, the control device 21 can be adapted to determine not only the timing of the output, but also another switching parameter based on the sensor signal and/or the other sensor signal, for example the height of the voltage applied to the switching coil 13, 14 for switching the switch 2, 3. Again, the switching system 20 can comprise one other sensor 24, 25 for each of the switches 2, 3.

Alternatively or additionally to the above-mentioned sensors 22, 23, 24, 25, the switching system 20 may comprise yet another sensor 26, 27 that is adapted to transform the temperature of the switch 2, 3 and in particular of its switching coil 13, 14 into a temperature sensor signal. In the following, this sensor is designated as temperature sensor 26, 27. The temperature sensor 26, 27 is connected to the control device 21 in a sensor signal transmitting manner. The control device 21 is adapted to adjust the timing of the output of the switching signal or the other switching parameter based on the temperature sensor signal.

Figure 2:
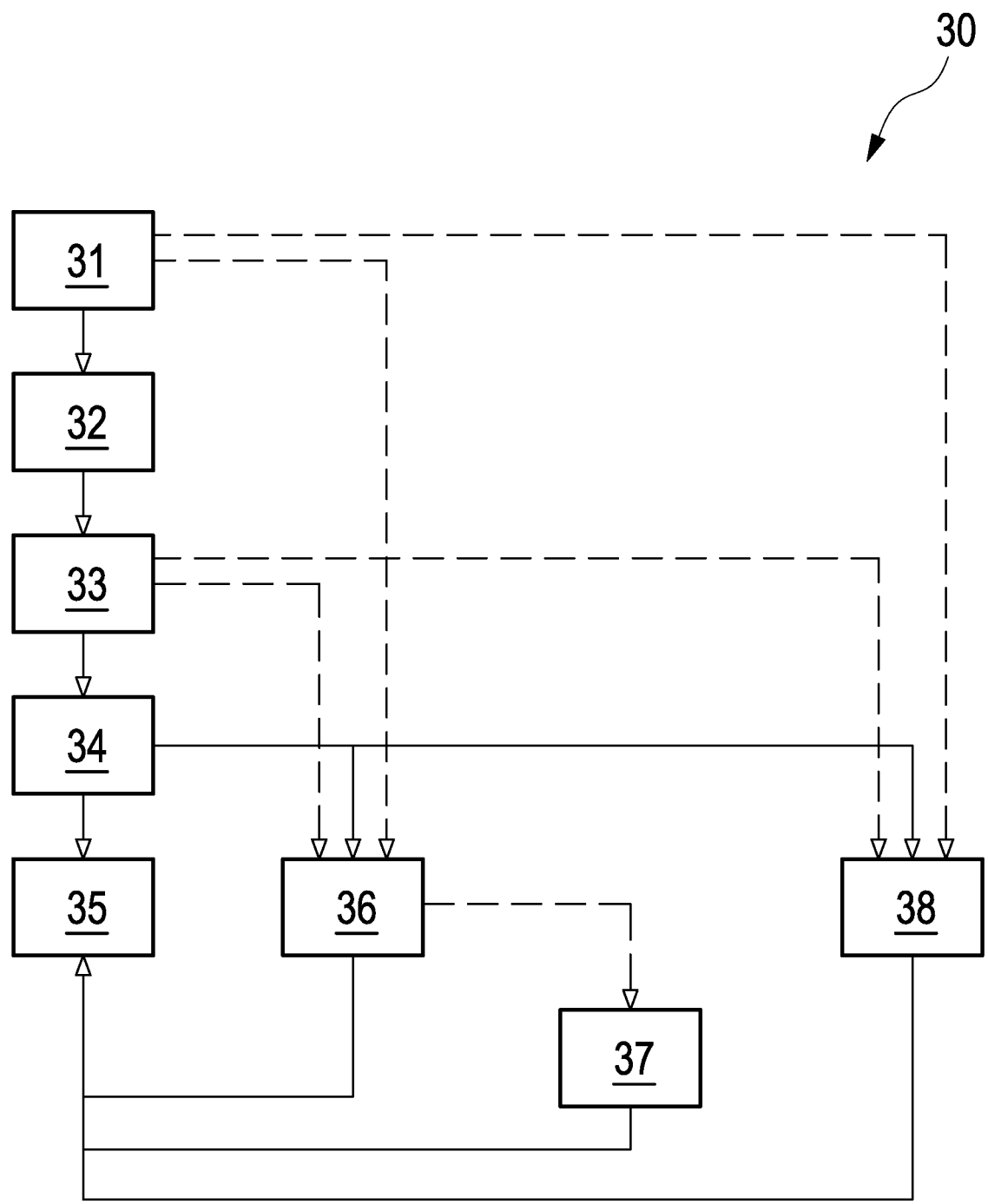
FIG. 2 shows an exemplary embodiment of a method according to the present invention.

FIG. 2 shows an exemplary embodiment of the method for switching a switch, e.g. a relay, according to the invention schematically as a flowchart. For elements of the electricity meter 1 and the switching system 20, which are used in the following for describing the method according to the invention, same reference signs are used as in the description of the exemplary embodiment of FIG. 1.

The method 30 for switching a switch according to the invention starts with a first method step 31, in which the switching signal is output at a first point in time. After outputting the switching signal, a switching state of the switch 2, 3 is detected in method step 32. A second point in time is defined, as soon as the detected switching state corresponds to a predefined switching state in method step 33. In the next method step 34 the difference between the two points in time is determined and for example calculated by the control device 21. Based on the time difference, the timing of an upcoming output of the switching signal is adjusted in method step 35, e.g. by the control device 21.

As shown in FIG. 2, instead of adjusting the timing merely based on the time difference, additionally the current drawn by switching coil 13, 14 of the switch 2, 3 can be detected during the switching event in method step 36, which can be performed between method steps 34 and 35 or in parallel to methods step 34. As another alternative, method step 36 can directly follow after method step 31 and can be used in addition or instead of method steps 32 to 34.

After method step 36, methods step 35 can be directly executed. Alternatively, method step 37 can follow method step 36 before the method 30 arrives at method step 35, wherein in method step 37, the duration of the move period of the switching contacts 9, 11 is determined. In method step 35, the timing can be adjusted based on the courier current and/or the move period.

As shown in FIG. 2, instead of adjusting the timing merely based on the time difference and/or the coil current and/or the duration of the move period, additionally the temperature of the switch 2, 3 and in particular of its switching coil 13, 14 can be detected during, before or after the switching event in method step 38, which can be performed between method steps 34 and 35 or in parallel to methods step 34. As another alternative, method step 38 can directly follow after methods step 31 and can be used in addition to or instead of method step 32 to 34 and/or method steps 36 and 37.

Hence, the timing can be adjusted based on the time difference, the coil current, the duration of the move period and/or the temperature. Additionally, other switching parameters like the voltage supplied to the coil during the switching event can be adjusted based on the time difference, the coil current, the duration of the move period and/or the temperature.

Before method step 31, zero crossings of the power to be switched and upcoming zero crossings can be determined. Additionally, based on the current drawn be the switching coil, based on the time difference and/or based on the duration of the move period, wear and tear of the switch may be determined or another switching parameter may be adjusted in method step 35.

Figure 3:
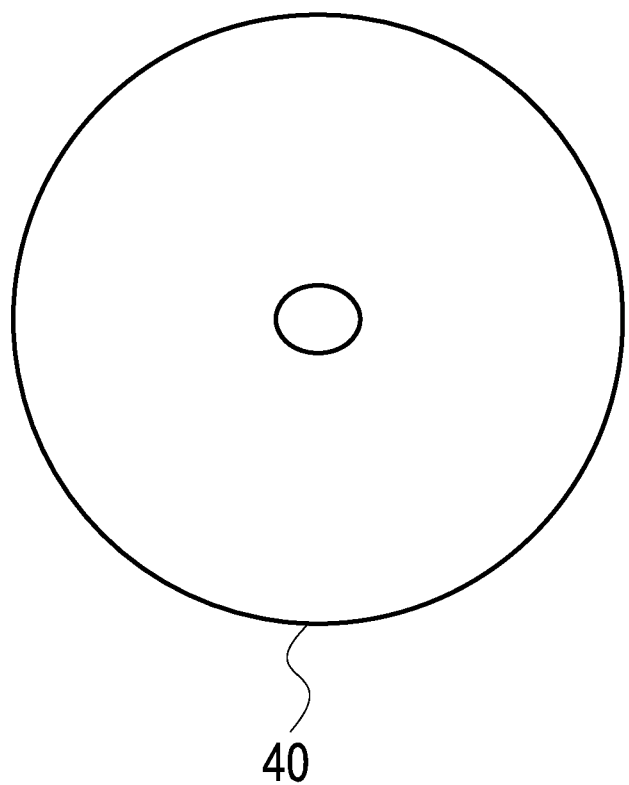
FIG. 3 shows an exemplary embodiment of a computer program product according to the present invention.

FIG. 3 schematically shows a computer program product 40 containing program code, wherein the software code is adapted to perform the method 30 when the software code is executed on a control device 21 of the switch system 20.

Figure 4:
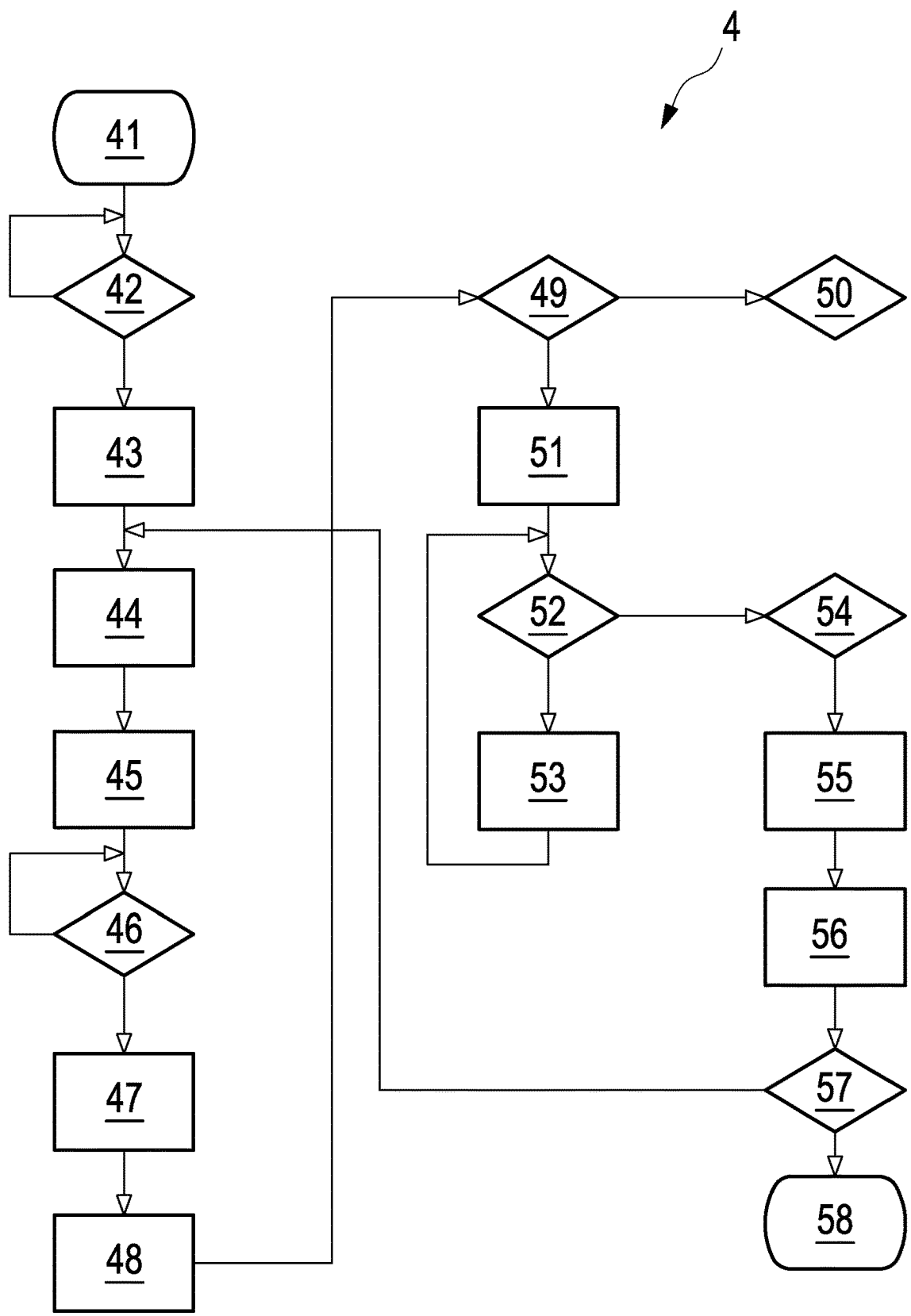
FIG. 4 shows an exemplary embodiment of an operation method of the electricity meter according to the invention, FIG. 5 exemplarily shows schematic signals when a switch closes, and FIG. 6 exemplarily shows a schematic diagram depicting the coil current over time while switching a switch.

FIG. 4 shows an exemplary operation method of the electricity meter 1 schematically as a flowchart. For elements of the electricity meter 1 and the switching system 20, which are used in the following for describing the operation method according to the invention, same reference signs are used as in the description of the exemplary embodiment of FIG. 1. Additionally, method steps of the method 30 of switching the switch 2, 3 that are used in the following, use the same reference signs as in the exemplary embodiment of FIG. 2.

The operation method 40 starts with method step 41. In the following method step 42, a request to switch the at least one switch 2, 3 is waited for. If no request to switch the at least one switch 2, 3 is received, the operation method 40 continues to wait for the request. After the request has been received, method step 43 is performed, in which a required time delay for outputting the switch signal after an upcoming zero crossing is determined, thereby at least partly performing method step 35. After the required time delay is determined, a zero crossing is waited for in method step 44. After the zero crossing has occurred, a delay timer is started in step 45. As long as the delay timer has not reached the determined time delay, the delay timer continues to run in method step 46.

As soon as the delay timer has reached the determined time delay, the at least one switch 2, 3 is activated, e.g. switched by outputting the switch signal, in method step 47. At the same time or after method step 47, a switching timer is started in method step 48, which may correspond to method step 31. After that, a contact change is waited for in method step 48, for example by performing method step 32. If no change of the switching state is detected in method step 49, e.g. if no voltage transitions are detected after a predetermined time period, e.g. up to 100 ms, 75 ms, 50 ms or 25 ms, it is assumed that the switch was closed with a very precise timing in method step 50, such that no arc occurred and no further adjustments of the timing are performed. If a change of the switching state is detected, e.g. if a voltage transition is detected, the method stores the contact closing time in method step 51, e.g. the time of the first contact of the switching contacts 9, 10, 11, 12 with each other.

In the event that a further change of contact state is detected within a predetermined time period, e.g. up to 100 ms, 75 ms, 50 ms or 25 ms in the following method step 52, method 40 continues in method step 53 and stores the time of this change of contact state as contact closing time, e.g. according to method step 33. In case no further change of contact state is detected within the predetermined time period, e.g. up to 100 ms, 75 ms, 50 ms or 25 ms in method step 52, method 40 continues in method step 54. In the following method step 55, a contact sealing time, at which the contacts are in a stable contact state and e.g. do not bounce anymore, is defined. In particular, the contact sealing time is defined by the last change of contact state. In method step 56, the determined times are stored. In the following optional method step 57, it is determined if the at least one switch 2, 3 is in the correct state. If the at least one switch 2, 3 is not in the correct state, method 40 returns to method step 44. If the at least one switch 2, 3 is in the correct state, method 40 ends with method step 58.

Figure 5:
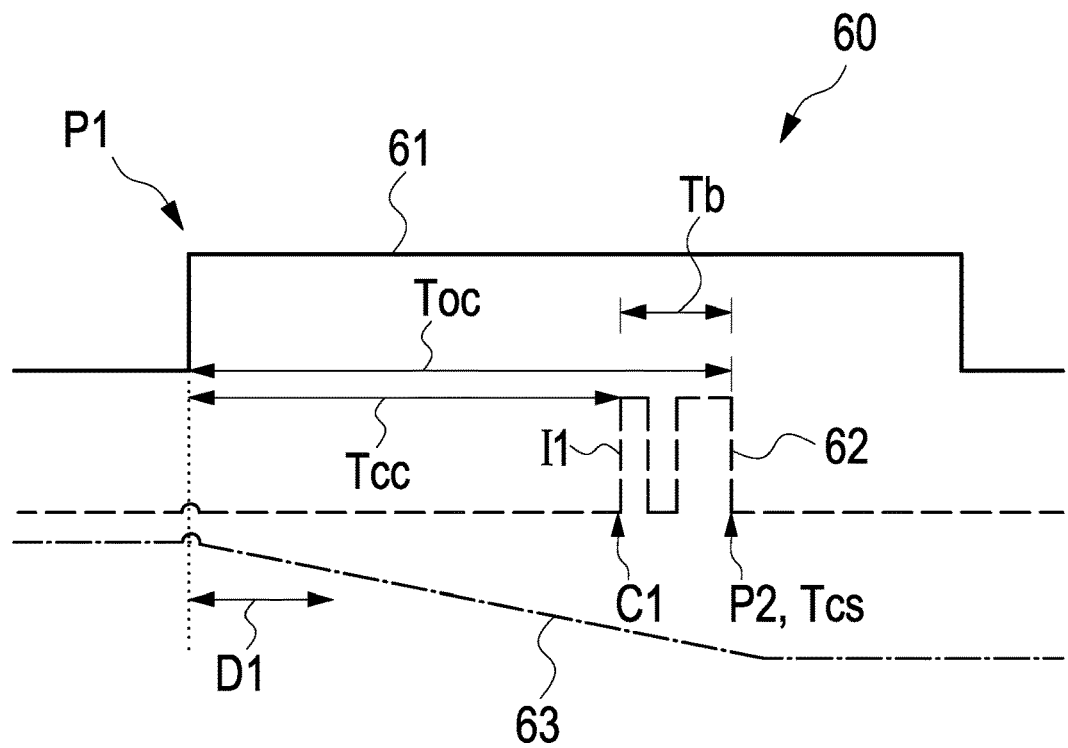

FIG. 5 shows a diagram with an exemplary embodiment of operation characteristics of a switch 2, 3, of the exemplary embodiment of the electricity meter 1 of FIG. 1, which may be used in any of the previously described methods 30, 40 for switching the switch 2, 3 and/or for operating the electricity meter 1. The diagram 60 shows the switching signal 61, an indicator signal of changing switching states 62, e.g. the sensor signal and for example voltage transitions, and an average distance 63 of the switching contacts 9, 10, 11, 12 of the at least one switch 2, 3 with respect to each other during a switching event over time.

For example at or after the first point in time P1, the switching signal 61 is output. The switching contacts 9, 10, 11, 12 of the at least one switch 2, 3 approach each other with a first delay D1 caused by magnetic field build-up as indicated by the change in line 63. After a first contact C1 of the switching contacts 9, 10, 11, 12 of the at least one switch 2, 3, the indicator signal 62 changes and forms an indicator peak 11. This indicator peak may be caused by a voltage transition. The time period Tcc is defined by the first point in time P1 and the first contact C1. Another indicator peak 12 following the first indicator peak 11 and indicates a subsequent change in switching state, e.g. a subsequent contact C2 following the first contact C1 as the contacts bounce. The subsequent change in switching state is the last change in switching state of the switching event according to the exemplary embodiment, if the switching contacts 9, 10, 11, 12 stopped bouncing. The switching contacts 9, 10, 11, 12 may bounce more often. By the end of the other indicator peak 12, the second point in time P2, e.g. the time of the last bounce Tcs is defined. After the second point in time P2, e.g. the time of the last bounce Tcs, the distance 63 does not change anymore until the next switching event.

Figure 6:
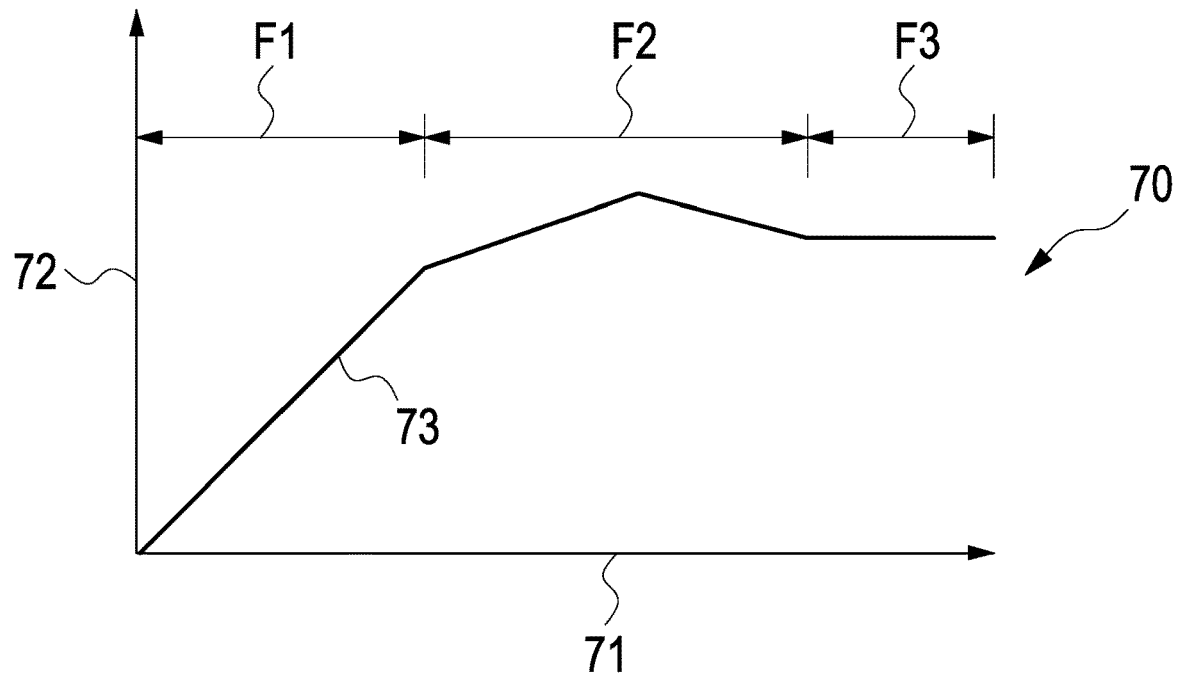

FIG. 6 shows a schematic diagram of the coil current over time during the switching event. Diagram 70 comprises an abscissa 71, which represents time, and an ordinate 72, which represents the current 73 drawn by the switching coil 13, 14 of the at least one switch 2, 3. During a first phase F1, which may correspond to the first delay D1 of the exemplar embodiment of FIG. 5, the coil current rises as the magnetic field of the switching coil 13, 14 of the at least one switch 2, 3 builds up. In a consecutive second phase F2, in which the coil current changes differently from phase F1, the switching contacts 9, 11 of the at least one switch 2, 3 move, such that the duration of the second phase F2 may correspond to the move period. After the second phase F2, a third phase F3 follows, during which the coil current is stable, e.g. in order to reduce bouncing by constantly pressing the contacts 9, 10, 11, 12 of the at least one switch 2, 3 against each other.

Deviations from the above-described embodiments are possible within the inventive idea. In particular, the electricity meter 1 and therefore a respective metering device 4 and switching system 20 may comprise supply control switches 2 and/or load control switches 3 as well as any kind of other switching devices operated according to the present invention. These switches 2, 3 and switching devices may include load and supply control switches in any number and form desired, in order to perform switching operations internally and externally of the electricity meter 1 for switching and operating internal and external/auxiliary components of the electricity meter 1. The switches 2, 3 and switching devices may comprise input terminals 5, output terminal 6, output terminal 7, input terminals 8, switching contacts 9, 10, 11, 12, switching coils 14, 15 and/or power sensors 15, 16, as well as controlling eyes 21, sensors 22, 23, other sensors 24, 25 and/or temperature sensors 26, 27 in any number and form required for performing switching operations in line with the present invention.

REFERENCE SIGNS 1 electricity meter
2 supply control switch
3 load control switch
4 metering device
5 input terminal
6 output terminal
7 output terminal
8 input terminal
9, 10, 11, 12 switching contact
13, 14 switching coil
15, 16 power sensor
20 switching system
21 controlling eyes
22, 23 sensor
24, 25 other sensor
26, 27 temperature sensor
30 method
31 output switching signal at first point in time
32 determine switching state
33 determine second point in time
34 determine time difference
35 adjust timing
36 determine coil current
37 determine move period
38 determined temperature
40 operation method
41 start
42 wait for switching request
43 determine time delay
44 wait for zero crossing
45 start delay timer
46 continue delay timer
47 activate switch
48 start switching
49 wait for change of switching state
50 do not change time delay
51 store contact closing time
52 detect change of switching state
53 store time of change
54 wait for predetermined time period
55 determine last change of switching state
56 store times
57 determine of switch is in correct state
58 end
60 diagram
61 switching signal
62 indicator
63 distance between switching contacts
70 diagram
71 abscissa
72 ordinate
73 coil current
C1, C2 first contact ,subsequent contact
D1 first delay
F1, F2, F3 first to third phases
I1, I12 indicator peaks
P1, P2 first point in time, second point in time
Tcc time period
Tcs time of last bounce
Toc previous time required for switching/previous time difference

The invention claimed is:

1. A switch system for an electricity meter with at least one switch, namely a supply control switch and/or a load control switch, wherein
the switch system comprises a control device that is adapted to output a switching signal to the at least one switch for starting a switching event of the at least one switch,
wherein the switch system comprises a sensor that is adapted to transform output current and/or output voltage of the at least one switch into a sensor signal, the sensor being connected to the control device in a sensor signal transmitting manner, wherein
the control device is adapted to determine a switching state of the at least one switch based on the sensor signal, to determine a time difference between a first point in time at which the switching signal is output, and a second point in time, at which the switching state of the at least one switch corresponds to a predefined switching state, and to adjust the timing of the output of the switching signal based on the time difference and with respect to a zero crossing of an AC voltage and/or current to be switched, wherein
the switch system comprises another sensor that is adapted to transform current drawn by a switching coil of the at least one switch into another sensor signal, and that is connected to the control device in a sensor signal transmitting manner, wherein the control device is adapted to adjust the timing of the output of the switching signal based on the other sensor signal.

2. A switch system according to claim 1, wherein the control device is adapted to determine a move period that starts when a switching contact of the switch begins to move during the switching event and that ends when the switch is in a closed, open, or another predefined switching state based on the other sensor signal, wherein the control device is adapted to adjust the timing of the output of the switch signal based on a duration of the move period.

3. A switch system according to claim 2, wherein the control device is adapted to determine a wear and tear state of the switch or to adjust a switching parameter based on the sensor signal.

4. A switch system according to claim 1, wherein the control device is adapted to determine a wear and tear state of the switch or to adjust another switching parameter based on the other sensor signal.

5. A switch system according to claim 4, wherein the control device is adapted to determine a wear and tear state of the switch or to adjust a switching parameter based on the sensor signal.

6. A switch system according to claim 1, wherein the control device is adapted to determine a wear and tear state of the switch or to adjust another switching parameter based on at least one of the sensor signal and the other sensor signal.

7. A switch system according to claim 1, wherein the control device is adapted to determine a wear and tear state of the switch or to adjust a switching parameter based on the sensor signal.

8. A switch system according to claim 1, wherein the switch system comprises yet another sensor that is adapted to transform a temperature of the at least one switch into a temperature sensor signal, and that is connected to the control device in a sensor signal transmitting manner, wherein the control device is adapted to adjust the timing of the output of the switching signal based on the temperature sensor signal.

9. An electricity meter with a switch system and with at least one switch, namely a supply control switch and/or a load control switch, wherein the switch system is the switch system of claim 1.

10. A method for switching a switch, wherein the method comprises the steps of
outputting a switch signal to a switch at a first point in time,
determining a switching state of the switch based on a voltage and/or a current output by the switch,
determining a second point in time at which the switching state corresponds to a predefined switching state,
determining a time difference between the first point in time and the second point in time,
adjusting the timing of a switching signal to be output based on the time difference and with respect to a zero crossing of an AC voltage and/or an AC current to be switched, and
determining current drawn by a switching coil of the switch, and by adjusting the timing of the switching signal to be output based on the current drawn by the switching coil.

11. A method according to claim 10, wherein based on the current drawn by the switching coil, a move period that starts when a switching contact of the switch begins to move during a switching event and that ends when the switch is in a closed, open, or another predefined switching state is determined, and in that the timing of the switching signal to be output is adjusted based on a duration of the move period.

12. A method according to claim 11, further comprising the steps of determining a wear and tear state of the switch or adjusting another switching parameter based on the current drawn by the switching coil.

13. A method according to claim 11, further comprising the steps of determining a wear and tear state of the switch or adjusting another switching parameter based on the time difference.

14. A method according to claim 10, further comprising the steps of determining a wear and tear state of the switch or adjusting another switching parameter based on the current drawn by the switching coil.

15. A method according to claim 10, further comprising the steps of determining a wear and tear state of the switch or adjusting another switching parameter based on the time difference.

16. A method according to claim 10, further comprising the steps of determining a temperature of the switch and adjusting the timing of the output of the switching signal based on the temperature.

17. A computer program product with software code, wherein the software code is adapted to perform the method of claim 10 when the software code is executed on a control device of a switch system.

18. A method according to claim 10, further comprising the steps of determining a wear and tear state of the switch or adjusting another switching parameter based on the time difference.

* * * * *